United States Patent
Lu et al.

(10) Patent No.: US 7,853,861 B2
(45) Date of Patent: Dec. 14, 2010

(54) DATA PROTECTING METHOD OF STORAGE DEVICE

(75) Inventors: Ying-Chih Lu, Taipei (TW); Chi-Tsung Chang, Taipei (TW)

(73) Assignee: Inventec Corporation, Taipei (TW)

( * ) Notice: Subject to any disclaimer, the term of this patent is extended or adjusted under 35 U.S.C. 154(b) by 973 days.

(21) Appl. No.: 11/675,484

(22) Filed: Feb. 15, 2007

(65) Prior Publication Data

US 2008/0222458 A1 Sep. 11, 2008

(51) Int. Cl.
*H03M 13/00* (2006.01)
*G08C 25/00* (2006.01)
*H04L 1/00* (2006.01)

(52) U.S. Cl. .................. 714/799; 714/48; 714/758; 714/765

(58) Field of Classification Search ................. 714/799, 714/48, 758, 765
See application file for complete search history.

(56) References Cited

U.S. PATENT DOCUMENTS 6,674,599 B1 * 1/2004 Rae et al. .................... 360/72.1
2004/0255179 A1 * 12/2004 Mayer ........................... 714/1

* cited by examiner

*Primary Examiner*—Guy J Lamarre
(74) *Attorney, Agent, or Firm*—J.C. Patents

(57) ABSTRACT

A data protection method of a storage device, applied in a computer having a storage device, is provided. The storage device is consisted of a plurality of blocks. The method includes the following steps. When a data containing a plurality of bit data is stored in the storage device in the computer, the stored bit data is checked bit by bit. If an incorrect bit data is checked, the data in the block containing the incorrect bit data is backed up to a reserved block. Therefore, the memory capacity of the storage device is not occupied while backing up data, so as to improve the reliability of the computer.

7 Claims, 2 Drawing Sheets

DATA PROTECTING METHOD OF STORAGE DEVICE

BACKGROUND OF THE INVENTION

1. Field of the Invention

The present invention relates to a data protection method of a storage device. More particularly, the present invention relates to a data protection method, which is applied in a computer having a storage device and will not occupy the spare memory capacity of the storage device when backing up the data.

2. Description of Related Art

With economic booming and the development of science and technology, various computers and servers become increasingly popular. However, the memory plays an extremely important role in the computer and the server, and influences system performance more than in the past. Only 1 bit error occurred in the memory will cause the data to be incorrect or lost, thereby seriously puzzling consumers.

A conventional data storage technology of a dual in-line memory module (DIMM) employs three modes to backup data, namely, a standard mode, a spare mode, and a mirror mode. In the standard mode, all DIMMs are mapped to memory spaces and a basic input/output system (BIOS) reports the mapped memory spaces to an operating system (OS), such that the OS may learn and manage the memory spaces of all the DIMMs. In the spare mode, a part of the DIMMs are used as a spare memory, and only the rest DIMMs are mapped to memory spaces. In addition, in the mirror mode, one half of DIMMs are used as a mirror DIMM, and then these two parts of DIMMs are mapped to the same memory space. That is, only one half of the memory can be accessed by the OS. However, in spite of the high reliability, the spare mode and the mirror mode should occupy a part or a set of memories with the same capacity for backup, and results in that only a part of memory capacity can be accessed, thereby wasting money and memory.

Therefore at present, how to prevent the data for backup from occupying the memory space that reduces the available capacity of the memory has become a serious problem.

SUMMARY OF THE INVENTION

In view of the disadvantages of the conventional art, the present invention is mainly directed to provide a data protection method of a storage device. The bit data to be stored in the storage device is checked first, so as to find bad blocks of the storage device. Therefore, the spare memory capacity of the storage device is not occupied when backing up the data, and the reliability of the computer is improved.

As embodied and broadly described herein, the data protection method of a storage device provided by the present invention is applied in a computer having a storage device. The storage device is consisted of a plurality of blocks. The method includes the following steps. When a data containing a plurality of bit data is stored in the storage device in the computer, the stored bit data is checked bit by bit. If an incorrect bit data is checked, the data in the block storing the incorrect bit data is backed up to a reserved block.

In another embodiment of the data protection method of the storage device provided by the present invention, the data protection method of the storage device further includes a step that the computer counts the quantity of the blocks containing the incorrect bit data and determines whether the quantity is larger than a preset value. If the quantity is larger than the preset value, a warning signal is output.

The checking step performed by the computer includes following steps. First, the bit data to be stored is stored in the storage device; next, the bit data stored in the storage device is read; then, whether the read bit data and the bit data to be stored are the same is determined. If the read bit data and the bit data to be stored are different, it is indicated that the block contains the incorrect bit data.

The checking step performed by the computer includes performing odd parity bit check or even parity bit check on the bit data stored in the storage device, so as to determine whether the bit data in the block is incorrect.

Therefore, the data protection method of the storage device provided by the present invention efficiently solves the problem of the conventional art that a backup block must be reserved in the storage device, thus reducing the available memory capacity of the storage device. Further, the user is instantly informed to replace the storage device to be damaged, thereby increasing the available capacity of the storage device and improving the reliability of the computer.

DESCRIPTION OF EMBODIMENTS

In the following, the implementation method of the present invention is illustrated through specific embodiments, and those skilled in the art may easily understand other advantages and functions of the present invention from the contents disclosed in the specification.

Figure 1:
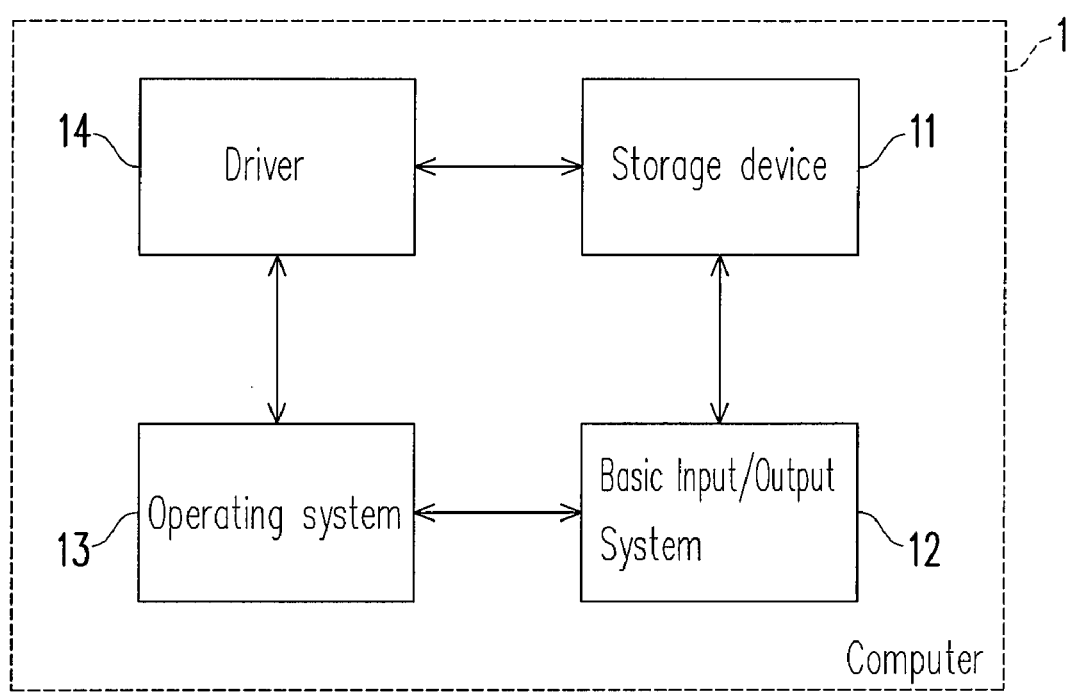
FIG. 1 is a schematic block diagram of a basic architecture of performing the data protection method of a storage device provided by the present invention.

Referring to FIG. 1, a block-diagram of the computer employing the data protection method of the storage device provided by the present invention is shown. As shown in FIG. 1, the computer 1 employing the data protection method of the storage device provided by the present invention is composed of a storage device 11, a BIOS 12, an OS 13, and a driver 14. It is necessary to illustrate that the computer 1 of the present invention further has other various functional units, and in order to simplify the drawings and the illustration, only the components relevant to the present invention are shown in the architecture in FIG. 1, while the hardware architectures of other components (such as a south bridge and a north bridge) are not. The computer 1 is, for example, a personal computer or a server, the storage device 11 is, for example, a Dual In-line Memory Module (DIMM), and the OS 13 is, for example, a Microsoft Windows OS or a Unix system.

During booting, the BIOS 12 executes initialization operations, such as function and parameter tests, on the storage device 11. More specifically, it is called the Power On Self Test (POST). For example, the storage capacity and the memory type of the storage device 11 are obtained, and the memory type is, for example, DRAM or SRAM. After it is assured that the storage device 11 may run normally, the BIOS 12 allows the computer 1 to load the OS 13, and reports the capacity of the storage device 11 to the OS 13.

Next, the OS 13 executes the driver 14 for driving an input/output control unit (not shown, such as a south bridge chip and a north bridge chip) to control the operation of apparatuses, such as the storage device 11 or an expansion card (not shown). For example, the memory capacity provided by the storage device 11 is used for storing data, and in the data storage process, the data protection method of the storage device provided by the present invention is performed, such that when it is checked that the storage device has a damaged storage block, the data to be stored is then stored in an available storage block as soon as possible, thereby increasing the available, capacity of the storage device and improving the reliability of the data storage.

Figure 2:
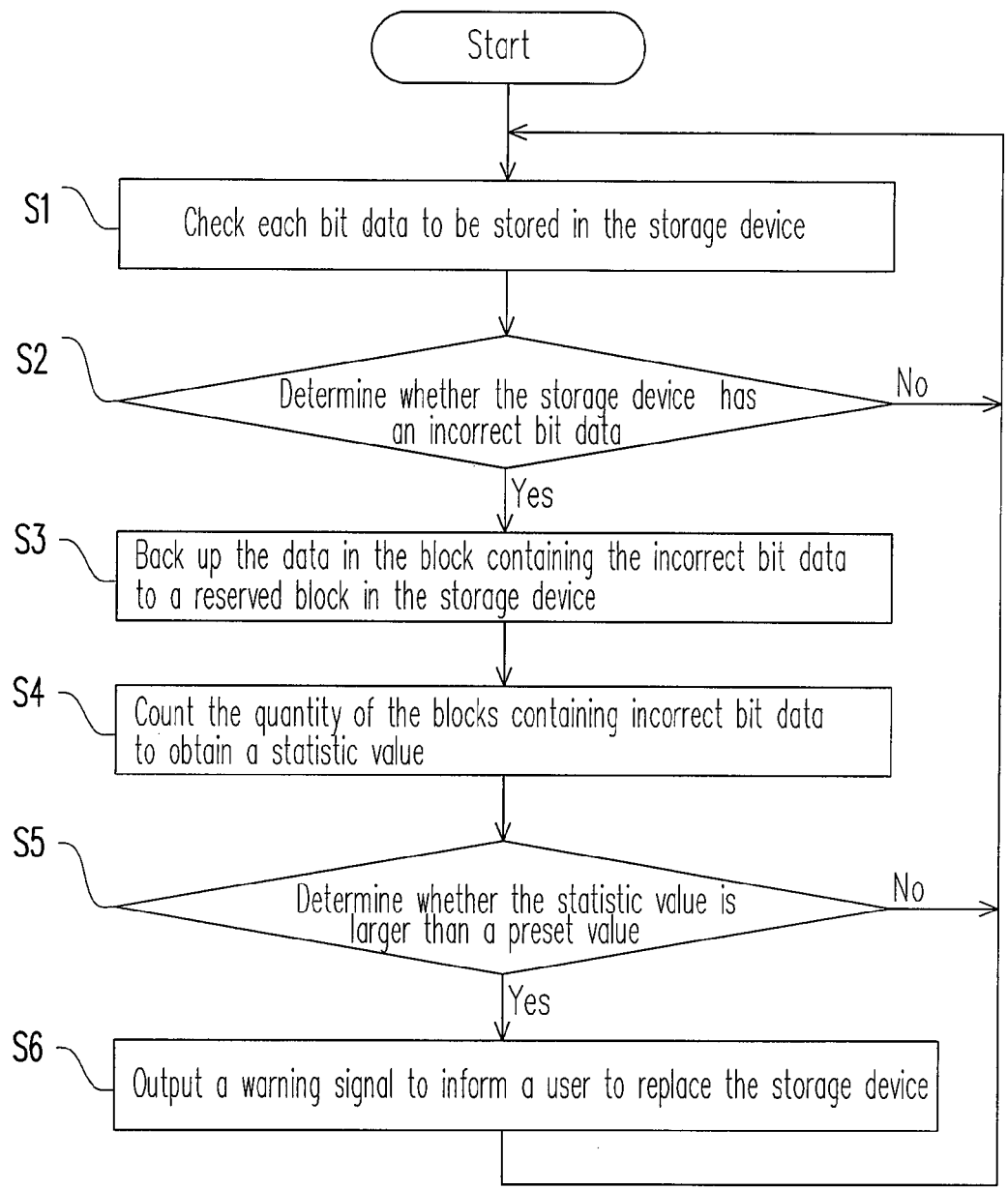
FIG. 2 is a schematic diagram of the flow of the data protection method of the storage device provided by the present invention.

FIG. 2 is a flow chart of the first embodiment of the data protection method of the storage device provided by the present invention. Generally, after the computer 1 is just powered on, the BIOS 12 performs the POST including performing initialization operations on the storage device 11 to get the information about the storage capacity and the memory type of the storage device 11. Next, the OS 13 is loaded. When the OS 13 begins to store data into the storage device 11, the process is proceeded to Step S1 immediately, in which the computer 1 checks each bit data to be stored in the storage device 11. In detail, the stored bit data is checked bit by bit. In this embodiment, the checking step includes the following methods. In one method, a bit data in the storage device 11 is stored, and the bit data stored in the storage device 11 is read. Then, whether the read bit data and the bit data originally to be stored are the same is determined. In the other method, an odd parity bit check or even parity bit check on the bit data stored in the storage device 11 is performed, so as to determine whether the bit data in the block is incorrect. Then, the process is proceeded to Step S2.

In Step S2, the computer 1 determines whether the storage device 11 has an incorrect bit data according to the result obtained after the checking step. If yes, the process is proceeded to Step S3, otherwise, the process is returned to Step S1. More specifically, the method of determining whether the storage device 11 has an incorrect bit data is performed through comparing and determining whether the read bit data in Step S1 and the bit data to be stored are the same. If yes, it is indicated that the storage device 11 does not have any incorrect bit data. Otherwise, it is indicated that the storage device 11 has incorrect bit data.

In Step S3, the computer 1 backs up the data in the block containing the incorrect bit data of the storage device 11 to a reserved block in the storage device 11, and then the process is proceeded to Step S4.

In Step S4, the computer 1 counts the quantity of the blocks containing incorrect bit data, so as to obtain a statistic value, and then the process is proceeded to Step S5.

In Step S5, the computer 1 determines whether the statistic value is larger than a preset value. If yes, the process is proceeded to Step S6, otherwise, the process is returned to Step S1. In Step S6, after comparing, the computer 1 learns that the quantity of the blocks containing incorrect bit data of the storage device 11 is larger than the preset value (i.e., the threshold value of the acceptable quantity of the damaged blocks of the storage device), and outputs a warning signal to inform a user to replace the storage device 11. Then, the process is returned to Step S1. Specifically, the preset value may be prestored in the driver 14 in the computer 1, such that after the computer 1 loads the OS 13 and executes the driver 14, in the process of storing data in the storage device 11, the driver 14 is ordered to perform Step S2 to check the bit data and to perform Step S5 to determine whether the quantity of the blocks with incorrect bit data is larger than a security value.

In the first embodiment of the data protection method of the storage device provided by the present invention, the capacity of the storage device 11 is consisted of a plurality of blocks each with the size of the capacity of 1 k bits. With regard to the process of backing up the data stored in the block with the incorrect bit data to the reserved block in the storage device 11, it refers to that, when at least one bit data is checked incorrect in the block to store the bit data, it is believed that the block with the incorrect bit data has already been damaged so as to perform the backup process. By the method of checking the damaged block of the storage device, the reserved block for backup in the storage device is unnecessary, so as to increase the available capacity of the storage device.

Moreover, the preset value is the threshold value for damaging the storage device 11. In other words, it is the acceptable security value of the storage device 11, and is set according to the reliability of the data storage required by the computer 1. The higher the preset value is, the lower the reliability of the data storage is. On the contrary, the lower the preset value is, the higher the reliability is.

Furthermore, in the second embodiment of the data protection method of the storage device provided by the present invention, after Step S3 is performed, the block with the incorrect bit data is marked as a damaged block, such that the user may identify available blocks and damaged blocks in the storage device conveniently.

To sum up, the data protection method of the storage device provided by the present invention may efficiently solve the problem of the conventional art that a backup block must be reserved in the storage device, thus reducing the available memory capacity of the storage device. In addition, according to the data protection method of the storage device provided by the present invention, by determining whether the bit data stored in the storage device and the bit data originally to be stored are the same, whether the storage blocks provided by the storage device are damaged can be determined, so as to assure the bit data to be stored in the readable block in the storage device. Furthermore, the way of immediately informing the user to replace the storage device to be damaged may improve the reliability of the computer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data protection method of a storage device, applied in a computer having a storage device, wherein the storage device is consisted of a plurality of blocks, the data protection method comprising:

when a data containing a plurality of bit data is stored in the storage device in the computer, checking the stored bit data bit by bit;

if the bit data is checked incorrect, backing up the data in the block storing the incorrect bit data to a reserved block;

marking the block containing the incorrect bit data as a damaged block; and counting the quantity of the blocks containing the incorrect bit data and determining whether the quantity is larger than a preset value or not, wherein if the quantity is larger than the preset value, a warning signal is output.

2. The data protection method of a storage device as claimed in claim 1, wherein the preset value is set according to a reliability required by the computer, wherein the higher the preset value is, the lower the reliability of data storage is, and, on the contrary, the lower the preset value is, the higher the reliability of the data storage is.

3. The data protection method of a storage device as claimed in claim 1, further comprising a step that the computer marks the block containing the incorrect bit data as a damaged block.

4. The data protection method of a storage device as claimed in claim 1, wherein the size of each of the blocks is 1 k bits.

5. The data protection method of a storage device as claimed in claim 1, wherein the storage device is a dual in-line memory module (DIMM).

6. The data protection method of a storage device as claimed in claim 1, wherein the checking step performed by the computer comprises:

storing the bit data to be stored in the storage device;
reading the bit data stored in the storage device;
determining whether the read bit data and the bit data to be stored are the same; and
indicating that the block contains the incorrect bit data if the read bit data and the bit data to be stored are different.

7. The data protection method of a storage device as claimed in claim 1, wherein the checking step performed by the computer comprises:

performing odd parity bit check or even parity bit check on the bit data stored in the storage device, so as to determine whether the bit data in the block is incorrect.

* * * * *